(12) United States Patent
McManus

(10) Patent No.: US 6,844,770 B2
(45) Date of Patent: Jan. 18, 2005

(54) CIRCUITRY TO PROVIDE A LOW POWER INPUT BUFFER

(75) Inventor: Michael J. McManus, Liberty Township, OH (US)

(73) Assignee: Virtual Silicon Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/419,050

(22) Filed: Apr. 16, 2003

(65) Prior Publication Data

US 2004/0021509 A1 Feb. 5, 2004

Related U.S. Application Data

(60) Provisional application No. 60/373,744, filed on Apr. 17, 2002.

(51) Int. Cl.⁷ ............................................. H03L 5/00
(52) U.S. Cl. ........................................ 327/333; 327/108
(58) Field of Search ......................... 327/108–112, 333; 326/80, 81

(56) References Cited

U.S. PATENT DOCUMENTS

| | | | | |
|---|---|---|---|---|
| 4,506,164 A | * | 3/1985 | Higuchi | 326/81 |
| 4,672,241 A | | 6/1987 | Venkatesh | 326/81 |
| 4,982,113 A | * | 1/1991 | Jinbo | 326/80 |
| 5,084,637 A | * | 1/1992 | Gregor | 326/81 |
| 5,742,183 A | * | 4/1998 | Kuroda | 326/81 |
| 5,828,262 A | * | 10/1998 | Rees | 327/390 |
| 5,880,605 A | | 3/1999 | McManus | 326/86 |
| 5,946,175 A | * | 8/1999 | Yu | 361/56 |
| 5,952,866 A | * | 9/1999 | Kothandaraman et al. | 327/333 |
| 6,163,179 A | * | 12/2000 | Huang et al. | 327/108 |
| 6,275,425 B1 | * | 8/2001 | Eliason | 365/189.11 |
| 6,683,486 B2 | * | 1/2004 | Hanson et al. | 327/333 |
| 6,690,222 B2 | * | 2/2004 | Nair | 327/205 |

OTHER PUBLICATIONS

K. Bernstein et al., *High Speed CMOS Design Styles*, IBM Microelectronics, Kluwer Academic Publishers, pp. 240–241, 1998.

* cited by examiner

Primary Examiner—Kenneth B. Wells
(74) Attorney, Agent, or Firm—Sierra Patent Group, Ltd.

(57) ABSTRACT

Input buffer circuitry that prevents high voltage output from high voltage circuitry from being applied to connected low voltage circuitry. An input of the input buffer circuitry receives signals from the high voltage circuitry. Pinch-off circuitry receives the input signals and prevents voltage above a threshold voltage from being applied to an output of the pinch-off circuitry. Boost circuitry controls the threshold voltage of the pinch-off circuitry and pull-up circuitry draws voltage from the output of the pinch-off circuitry to regulate the control by the booster circuitry.

19 Claims, 4 Drawing Sheets

CIRCUITRY TO PROVIDE A LOW POWER INPUT BUFFER

CROSS-REFERENCE TO RELATED APPLICATION

This application claims priority to provisional application 60/373,744 filed on Apr. 17, 2002, and which is hereby explicitly incorporated by reference as if set forth below.

BACKGROUND OF THE INVENTION

1. Field of the Invention

The present invention relates to an input buffer. More particularly, this invention relates to a low power input buffer. Still more particularly, this invention relates to a low power input buffer that is tolerant of a 5 volt input.

2. The Prior Art

Most electronic devices used in today's society are made up of many different integrated circuits. The integrated circuits in these devices are becoming denser as the dimensions of semiconductors components of the integrated circuits decrease. The decreased dimensions of the semiconductor components allow for faster devices that do not require as much power to operate. For example, many conventional components used to require 5 volts of power to operate. However, many current semiconductor components, such as transistors require approximately 3.3 volts to operate. The use of components having lower power requirements is important in mobile devices such as laptop computers and cellular telephones. The lower power allows a power supply in the device, such as a battery, to last longer and be smaller.

It is a problem that many devices still incorporate integrated circuits with the older high-powered components and integrated circuits with the new, lower power components. These devices may connect the lower power integrated circuits to high-powered integrated circuits. Thus, an integrated circuit operating on a lower voltage may receive an input at a higher voltage. This is a particular problem when an input of a higher voltage from a high voltage integrated circuit is applied to the lower voltage integrated circuit.

The particular problem is that the thin film oxide of the low voltage integrated circuit may suffer oxide breakdown from exposure to a voltage higher than the maximum supply voltage. This will cause catastrophic damage to the components of the low voltage integrated circuit.

One solution to this problem is shown by the input circuit 100 of FIG. 1. In input buffer circuit 100, high voltage integrated circuit 101 applies high voltage signals to path 102. An N-channel transistor 110 is connected to path 102 to prevent damage to the lower power integrated circuit. A source of transistor 110 connects to path 102. A drain of transistor 110 connects to path 103. A gate of transistor 110 connects to a supply voltage VDD via path 104. In this exemplary embodiment, the supply voltage VDD is 3.3 volts and the input signals are 5 volts.

Path 103 connects the drain of transistor 110 to the input buffer. In this exemplary prior art embodiment, the input buffer is an inverter 106. Inverter 106 is powered by supply voltage Vdd via path 113.

A high voltage signal from high voltage integrated circuit 101 causes transistor 110 to pinch off when the input voltage exceeds a gate voltage, Vg minus a threshold voltage, Vth. In this exemplary embodiment, the threshold voltage, Vth, is 0.6 volts. Therefore, the pinch off voltage passed through transistor 110 is 2.7 volts.

It is a problem with circuit 100 that the highest voltage that may pass through transistor 110 is the pinch off voltage. This causes inverter 106 to be partially biased. Thus, a static "totem pole" current is caused when the input signal from the integrated circuit 101 is high.

FIG. 2 illustrates a prior art buffer circuit 200 in which a pull-up device is added to path 103 in order to prevent a "totem pole" current flow. The pull-up device is P-channel pull-up transistor 220. The source of pull-up transistor 220 is connected to path 103 from the drain of transistor 110. The drain of pull-up transistor 220 is connected to a power supply, Vdd, via path 210. The gate of transistor 220 is connected to the output of inverter 106 via path 221. This allows the pull-up of transistor 220 to be controlled by the output of the input buffer.

It is a problem with circuit 200 that when the input from high voltage integrated circuit 101 transitions from low to high, there is a mid-range voltage at which the input buffer changes state which causes voltage to be applied to the gate of transistor 220. The application of voltage opens transistor 220. This may cause a violation of input leakage specifications that are typically 10 $\mu$amps.

Thus, there is a need in the art for a low power input buffer tolerant of high voltages that solves the above and other problems.

BRIEF DESCRIPTION OF THE INVENTION

The above and other problems in the art are solved by the input buffer circuitry designed in accordance with this invention. The input buffer circuitry designed in accordance with this invention connects low voltage circuitry to high voltage circuitry and prevents high voltage signals from the high voltage circuitry to be applied to low voltage circuitry in order to prevent damage to the low voltage circuitry.

In accordance with this invention, the input buffer circuitry is configured in the following manner. An input receives signals from the high voltage circuitry.

Pinch-off circuitry receives the signals from the input and prevents voltage in the signals that are above a threshold voltage from being applied to an output of said pinch-off circuitry. Boost circuitry controls the threshold voltage of the pinch-off circuitry and pull-up circuitry connects to the output of the pinch-off circuitry to draw voltage from the output of the pinch-off circuitry to regulate the control by the boost circuitry.

BRIEF DESCRIPTION OF THE DRAWING FIGURES

DETAILED DESCRIPTION OF THE INVENTION

The following description of exemplary embodiments of this invention is not intended to limit the scope of the invention to these embodiments, but rather to enable any person skilled in the art to make and use the invention.

Figure 1:
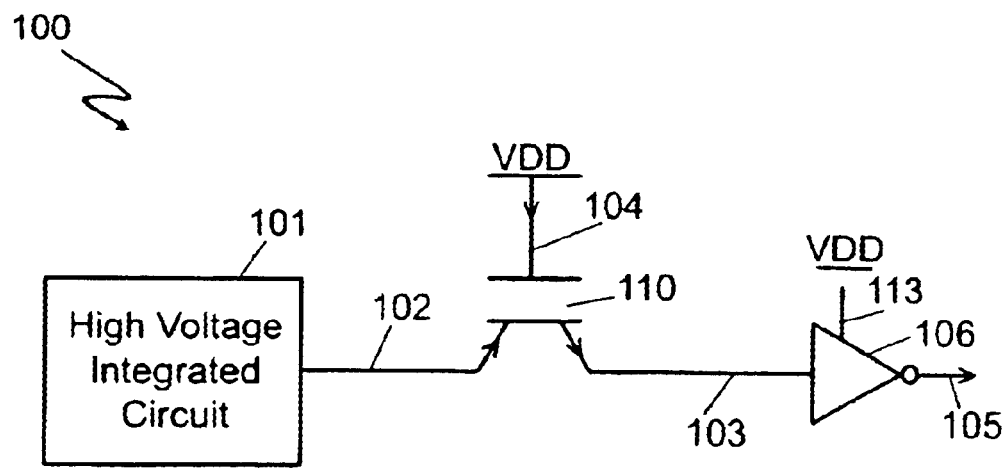
FIG. 1 is an exemplary embodiment of a prior art low voltage input buffer.
Figure 2:
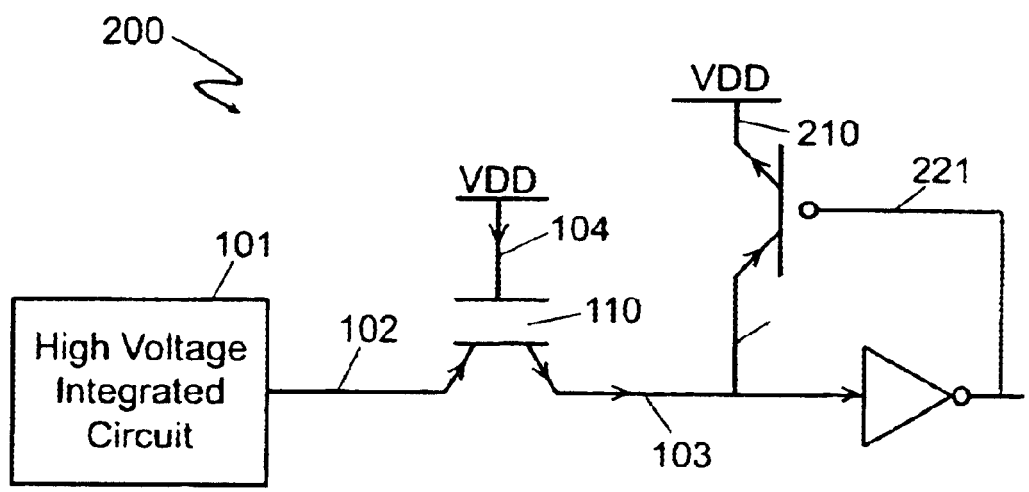
FIG. 2 is a second exemplary embodiment of a prior art low voltage input buffer.
Figure 3:
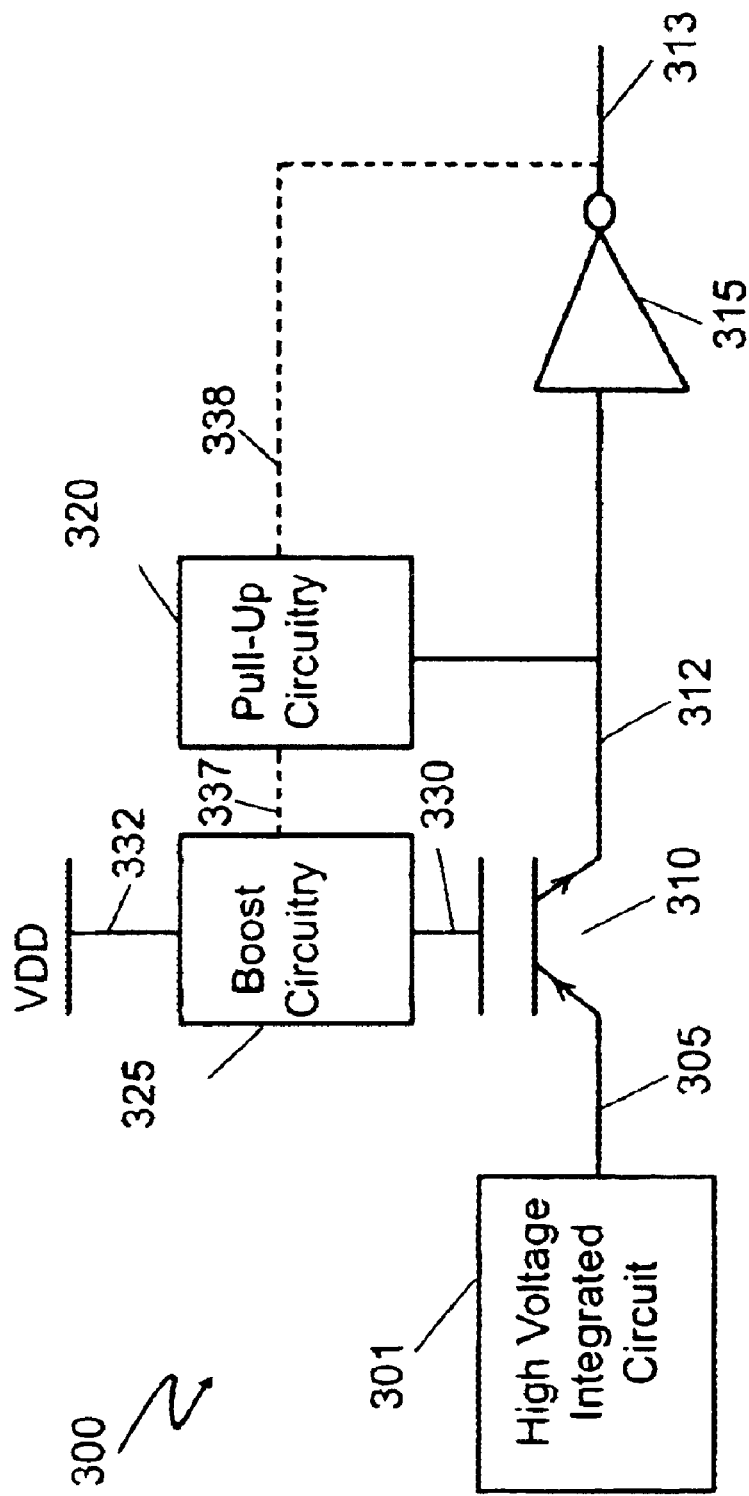
FIG. 3 is a block diagram of components of a low voltage input buffer in accordance with this invention.

FIG. 3 illustrates a block diagram of a low voltage input buffer circuit 300 in accordance with this invention. Low voltage input buffer 300 receives signals from high voltage integrated circuit 301 via path 305. The configuration of high voltage integrated circuit 301 does not matter for purposes of this invention. However, high voltage integrated circuit 301 does operate at a substantially higher voltage than circuitry connected to input buffer circuitry 300. Typically, this means that high voltage integrated circuit 301 operates at 5 volts and the circuitry connected to input buffer circuit 300 operates at 3.3 volts.

A source of pinch-off transistor 310 connects to path 305. The drain of pinch-off transistor 310 connects to path 312. The gate of pinch-off transistor 310 is connected to boost circuitry 325 via path 330. Preferably, pinch-off transistor 310 is an N-channel MOS transistor. Although one skilled in the art will recognize that other types of transistors may be used with some modifications to the configuration.

Boost circuitry 325 connects via path 330 to the gate of pinch-off transistor 310 and via path 332 to power supply Vdd. Preferably, power supply Vdd is 3.3 volts. Booster circuitry 325 increases the voltage applied to the gate of pinch-off transistor 310 to allow the voltage value passed through pinch-off transistor 310 to be increased. Booster circuitry 325 may be connected to pull-up circuitry 320 via path 337. The connection to pull-up circuitry 320 allows booster circuitry 325 to control the increase of voltage passed through pinch-off transistor 310 based on the voltage of pull-up circuitry 320.

Pull-up circuitry 320 connects to path 312 to draw current from path 312. Pull-up circuitry 320 may connect to the output of input buffer circuitry 300 via path 338 to control the amount of current pulled based upon the voltage at the output. Pull-up circuitry 320 may also connect to boost circuitry 325 via path 337. This allows boost circuitry 325 to control the amount of voltage passing through pinch-off transistor 310 based upon the amount of current drawn by pull-up circuitry 320.

Buffer circuitry, such as inverter 315, is connected to the drain of pinch-off transistor 310 via path 312. The buffer circuitry provides the signal to low voltage circuitry (Not Shown) via path 313.

Figure 4:
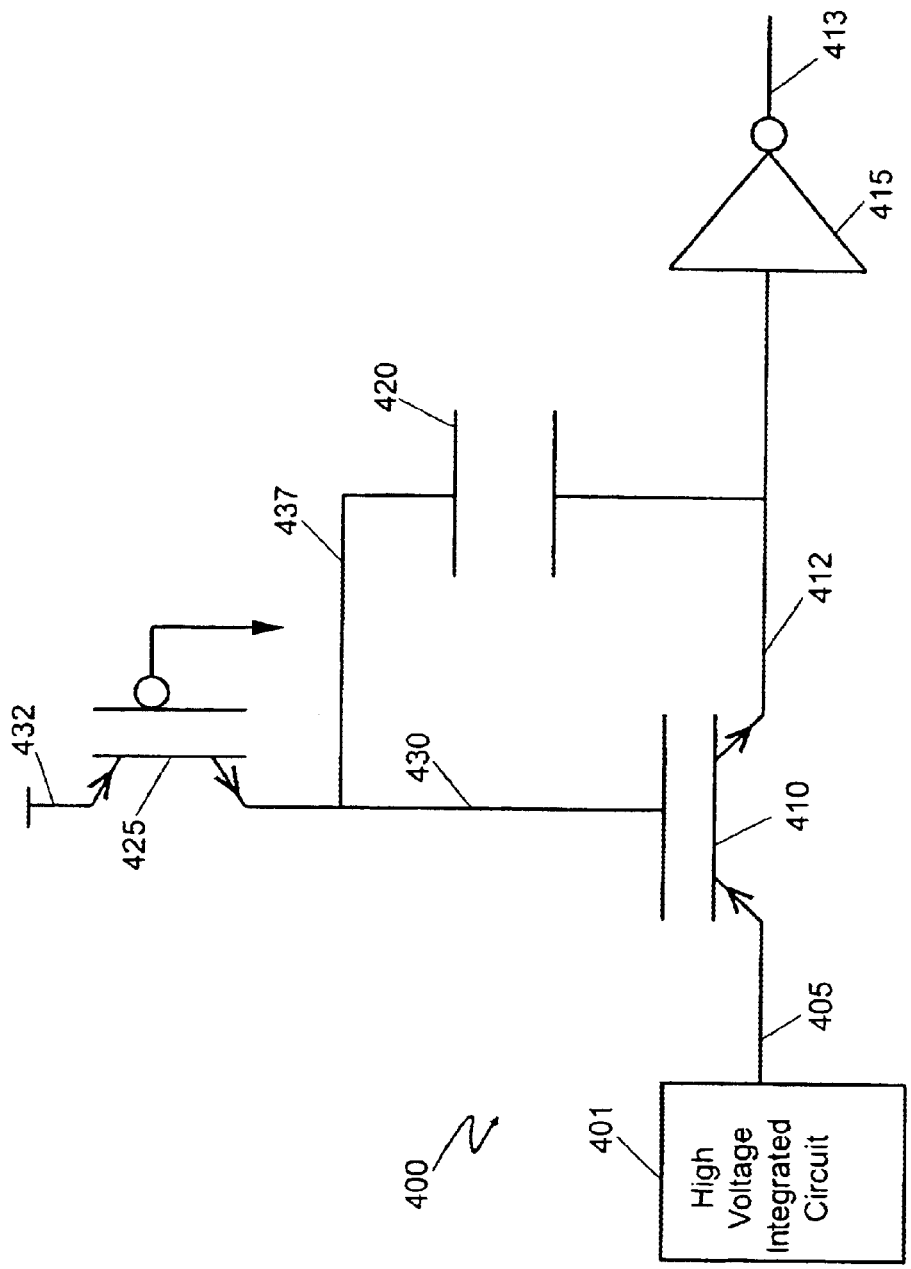
FIG. 4 is a first exemplary embodiment of a low voltage input buffer in accordance with this invention.

FIG. 4 illustrates a first preferred embodiment of a low power input buffer circuit 400 in accordance with this invention. Low voltage input buffer circuit 400 receives signals from high voltage integrated circuit 401 via path 405. The configuration of high voltage integrated circuit 401 does not matter for purpose of this invention. However, high voltage integrated circuit 401 does operate at a substantially higher voltage than circuitry connected to input buffer circuitry 400. Typically, this means that high voltage integrated circuit 401 operates at 5 volts and the circuitry connected to input buffer circuit 400 operates at 3.3 volts.

Pinch-off transistor 410 is a transistor used to pinch off excessive voltage received from high voltage integrated circuit 401. A source of pinch-off transistor 410 connects to path 405. The drain of pinch-off transistor 410 connects to path 412. The gate of pinch-off is connected to the drain of pull-up transistor 425 via path 430. Preferably, pinch-off transistor 410 is a N-channel MOS transistor. Although one skilled in the art will recognize that other types of transistors may be used with some modifications to the configuration.

Boost circuitry in this embodiment is provided by pull-up transistor 425. Preferably, pull-up transistor 425 is a p-channel MOSFET transistor. Although, those skilled in the art will recognize that other types of transistors may be used with minor modifications to circuitry 400. The drain of pull-up transistor 425 connects via path 430 to the gate of pinch-off transistor 410. The drain of pull-up transistor 425 is also connected via path 437 to the drain of bootstrap capacitor 420. The source of pull-up transistor 425 connects via path 432 to power supply Vdd. Preferably, power supply Vdd is 3.3 volts and supplied by the connected low voltage circuitry.

Pull-up transistor 425 increases the voltage applied to the gate of pinch-off transistor 410 to allow the voltage value passed through pinch-off transistor 410 to be increased. The connection of the drain of pull-up transistor 425 to the drain of bootstrap capacitor 420 allows pull-up transistor 425 to control the increase of voltage passed through pinch-off transistor 410 based on the voltage passing through bootstrap capacitor 420.

Bootstrap capacitor 420 connects to path 412 to draw current from path 412. Current passing through bootstrap capacitor 420 is applied to the gate of pinch-off transistor 410 via paths 430 and 437. Pull-up transistor 425 then controls the boost of pinch-off transistor 410 by controlling the amount of voltage from the power supply.

Buffer circuitry, such as inverter 415, is connected to the drain of pinch-off transistor 410 via path 412. The buffer circuitry provides the signal to low voltage circuitry (Not Shown) via path 413.

Input buffer circuitry 400 operates optimally under Alternating Current (AC) conditions having a high clock rate. However, input buffer circuitry 400 does not function optimally in conditions having Direct Current (DC) or a low clock rate.

Figure 5:
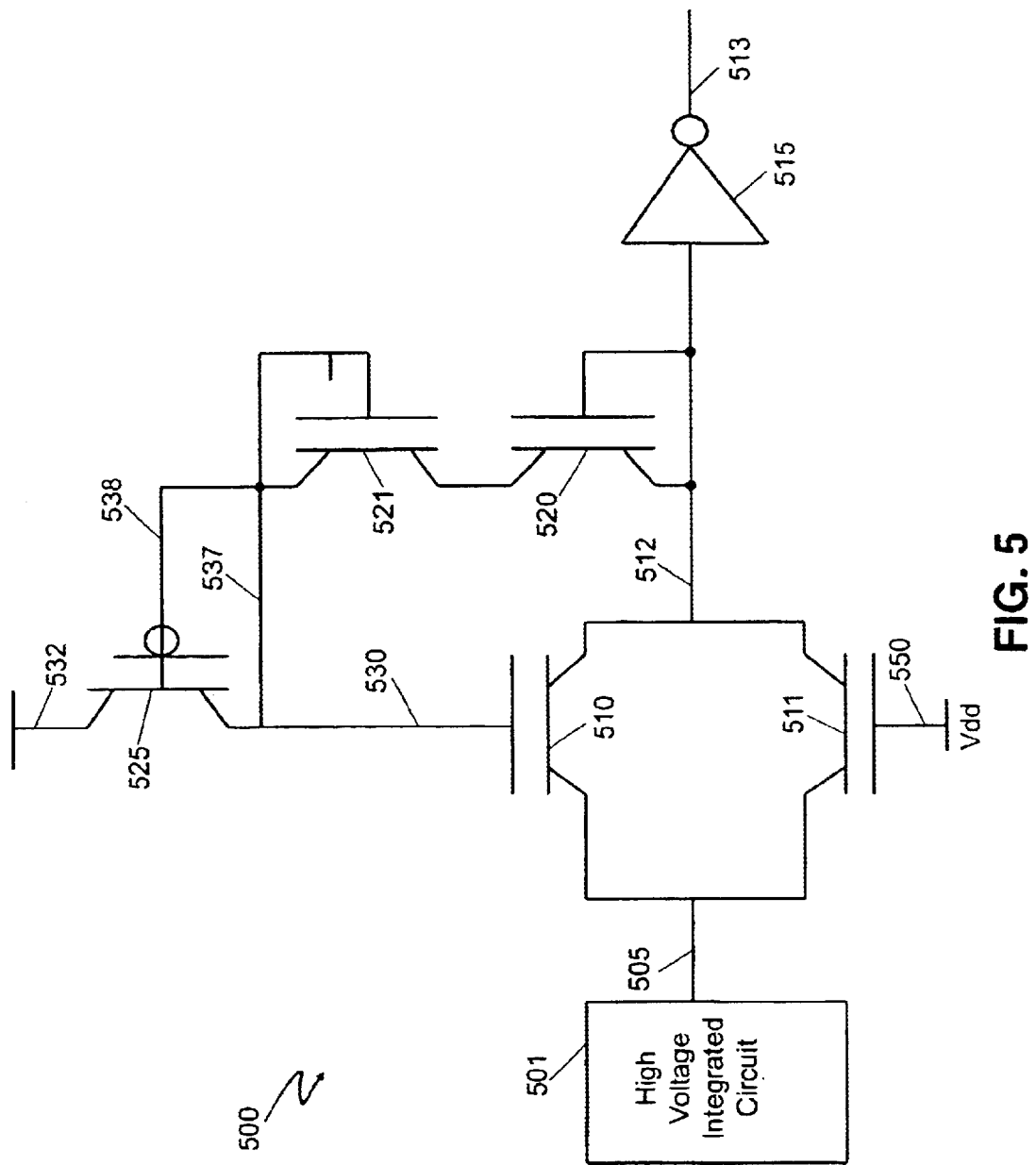
FIG. 5 is a second exemplary embodiment of a low voltage input buffer in accordance with this invention.

In order to operate in DC or low clock rate conditions, a second input buffer circuitry 500 shown in FIG. 5 may be used. Low voltage input buffer circuit 500 receives signals from high voltage integrated circuit 501 via path 505. The configuration of high voltage integrated circuit 501 does not matter for purpose of this invention. However, high voltage integrated circuit 501 does operate at a substantially higher voltage than circuitry connected to input buffer circuitry 500. Typically, this means that high voltage integrated circuit 501 operates at 5 volts and the circuitry connected to input buffer circuit 500 operates at 3.3 volts.

In input buffer circuitry 500 a first pinch-off transistor 510 and a second pinch-off transistor 511 are used to pinch off excessive voltage received from high voltage integrated circuit 501. First pinch-off transistor 510 and second pinch-off transistor 511 are connected in parallel to high voltage integrated circuit 501 and path 512.

A source of first pinch-off transistor 510 connects to path 505. The drain of first pinch-off transistor 510 connects to path 512. The gate of pinch-off transistor 510 is connected to the drain of pull-up transistor 525 via path 530. The gate of first pinch-off transistor 510 is connected to the gate and drain of second reverse biased diode transistor 521. Preferably, pinch-off transistor 510 is a N-channel MOS transistor. Although one skilled in the art will recognize that other types of transistors may be used with some modifications to the configuration.

A source of second pinch-off transistor 511 connects to path 505. The drain of second pinch-off transistor 511 connects to path 512. The gate of pinch-off is connected to a power supply, Vdd, via path 530. Preferably, power supply Vdd is 3.3 volts and supplied by the low voltage circuitry connected to input buffer circuitry 500. Preferably, pinch-off transistor 510 is a N-channel MOS transistor. Although one skilled in the art will recognize that other types of transistors may be used with some modifications to the configuration.

Boost circuitry in this embodiment is provided by pull-up transistor 525. Preferably, pull-up transistor 525 is a p-channel MOSFET transistor. Although, those skilled in the art will recognize that other types of transistors may be used with trivial modifications to circuitry 500. The drain of pull-up transistor 525 connects via path 530 to the gate of first pinch-off transistor 510. The drain of pull-up transistor 525 is also connected via path 537 to the drain and gate of second reversed biased diode transistor 520. The source of pull-up transistor 525 connects via path 532 to power supply Vdd. Preferably, power supply Vdd is 3.3 volts and supplied by the low voltage circuitry connected to input buffer circuitry 500.

Pull-up transistor 525 increases the voltage applied to the gate of first pinch-off transistor 510 to allow the voltage value passed through first pinch-off transistor 510 to be increased. The connection of the drain of pull-up transistor 525 to the drain and gate of second reversed bias diode transistor 521 allows pull-up transistor 525 to control the increase of voltage passed through first pinch-off transistor 510 based on the voltage passing through second reversed bias diode transistor 521.

The source and the gate of first reversed bias diode transistor 520 connects to path 512. The drain of first reversed bias diode transistor 520 connects to the source of second reversed bias diode transistor 521. The source and gate of first reversed bias diode transistor 520 are connected to path 512 to bias first reversed bias diode transistor 520. Preferably, first reverse bias diode transistor 520 is an N-channel MOSFET transistor. Although one skilled in the art will recognize that other type of transistors may be used with trivial modifications to circuitry 500.

The source of second reversed bias diode transistor 521 is connected to the drain of first reversed bias diode transistor 520. The drain and the gate of second reversed bias diode transistor 521 are connected to the drain of pull-up transistor 525 and gate of first pinch of transistor 510 via path 537. Preferably, second reversed bias diode transistor 521 is an N-channel MOSFET transistor. Although one skilled in the art will recognize that other type of transistors may be used with trivial modifications to circuitry 500.

First reversed bias diode transistor 520 and second reversed diode transistor 521 connect to path 512 to draw current from path 512. Current passing through first reversed bias diode transistor 520 and second reversed diode transistor 521 is applied to the gate of first pinch-off transistor 510 via paths 530 and 537. Pull-up transistor 525 then controls the boost of first pinch-off transistor 510 by controlling the amount of voltage from the power supply.

Buffer circuitry, such as inverter 515, are connected to the drains of first pinch-off transistor 510 and second pinch-off transistor 511 via path 512. The buffer circuitry provides the signal to low voltage circuitry (Not Shown) via path 513.

As any person skilled in the art will recognize from the previous description and from the figures and claims, modifications and changes can be made to these exemplary embodiments of the invention without departing from the scope of the invention defined in the following claims.

What is claimed is:

1. An input buffer circuitry that connects low power circuitry to high power circuitry wherein said low power circuitry operates at first voltage and said high power circuitry operates at a second voltage that is greater than said first voltage comprising:

an input that receives signals at said second voltage from said high power circuitry;

pinch-off circuitry that receives said signals and prevents voltage above a threshold voltage from being applied to an output of said pinch-off circuitry wherein said pinch-off circuitry includes a first pinch-off transistor and a second pinch-off transistor and wherein said first pinch-off transistor and said second pinch-off transistor are n-channel transistors;

boost circuitry that controls said threshold voltage of said pinch-off circuitry; and pull-up circuitry that connects to said output of said pinch-off circuitry to draw current from said output of said pinch-off circuitry.

2. The input buffer circuitry of claim 1 wherein said pull-up circuitry is connected to said boost circuitry to regulate control of said threshold voltage from said current drawn by said pull-up circuitry.

3. The input buffer of claim 1 wherein said pinch-off circuitry comprises:

a pinch-off transistor.

4. The input buffer circuitry of claim 3 wherein said pinch-off transistor is an N-channel transistor.

5. The input buffer circuitry of claim 3 further comprising:

a source of said pinch-off transistor connected to said input;

a drain of said pinch-off circuit connected to buffer circuitry and said pull-up circuitry; and a gate of said pinch-off transistor connected to said boost circuitry.

6. The input buffer circuitry of claim 5 wherein said boost circuitry is a pull-up transistor.

7. The input buffer circuitry of claim 6 wherein said pull-up transistor is a P-channel transistor.

8. The input buffer circuitry of claim 6 further comprising:

a source of said pull-up transistor connected to a power supply;

a drain of said pull-up transistor connected to said gate of said pinch-off transistor; and a gate of said pull-up transistor is connected to ground.

9. The input buffer circuitry of claim 8 said power supply is 3.3 volts.

10. The input buffer circuitry of claim 8 wherein said pull-up circuitry comprises:

a bootstrap capacitor.

11. The input buffer circuitry of claim 9 further comprising:

an input of said bootstrap capacitor connected to said drain of said pinch-off capacitor; and an output of said bootstrap capacitor connected to said drain of said pull-up transistor.

12. The input buffer circuitry of claim 1 further comprising:

a source of said first pinch-off transistor connected to said input;

a drain of said first pinch-off circuit connected to buffer circuitry and said pull-up circuitry;

a gate of said first pinch-off transistor connected to said boost circuitry;

a source of said second pinch-off transistor connected to said input;

a drain of said second pinch-off circuit connected to buffer circuitry and said pull-up circuitry; and a gate of said second pinch-off transistor connected to a power supply.

13. The input buffer circuitry of claim 12 wherein said boost circuitry comprises:
   a pull-up transistor.

14. The input buffer circuitry of claim 12 wherein said pull-up transistor is a P-channel transistor.

15. The input buffer circuitry of claim 12 further comprising:
   a source of said pull-up transistor connected to said power supply; and
   a drain of said pull-up transistor connected to said gate of said first pinch-off transistor.

16. The input buffer circuitry of claim 15 wherein said pull-up circuitry comprises:
   a first reverse bias diode; and
   a second reverse bias diode.

17. The input buffer circuitry of claim 16 wherein said first reverse bias diode comprises a first reverse bias diode transistor and said second reverse bias diode comprises a second reverse bias diode transistor.

18. The input buffer circuitry of claim 17 wherein said first reverse bias diode transistor and said second reverse bias diode transistor are N-channel transistors.

19. The input buffer circuitry of claim 17 further comprising:
   a source of said first reverse bias diode transistor connected to said drain of said first pinch-off transistor and said drain of said second pinch-off transistor;
   a drain of said first reverse bias diode transistor connected to a source of said second reverse bias diode transistor;
   a gate of said first reverse bias diode transistor connected to said drain of said first pinch-off transistor and said drain of said second pinch-off transistor;
   a drain of said second pinch-off transistor connected to said gate and said drain of said pull-up transistor and said gate of said first pinch-off transistor; and
   a gate of said second pinch-off transistor connected to said gate and said drain of said pull-up transistor and said gate of said first pinch-off transistor.

\* \* \* \* \*